(12) United States Patent
Yoshii et al.

(10) Patent No.: US 8,674,234 B2
(45) Date of Patent: Mar. 18, 2014

(54) MULTILAYER CERAMIC CAPACITOR MOUNTING STRUCTURE AND MULTILAYER CERAMIC CAPACITOR

(75) Inventors: Akitoshi Yoshii, Tokyo (JP); Kazuyuki Hasebe, Tokyo (JP); Keiko Kubo, Tokyo (JP); Naruki Kataoka, Tokyo (JP)

(73) Assignee: TDK Corporation, Tokyo (JP)

( * ) Notice: Subject to any disclaimer, the term of this patent is extended or adjusted under 35 U.S.C. 154(b) by 298 days.

(21) Appl. No.: 12/943,430

(22) Filed: Nov. 10, 2010

(65) Prior Publication Data

US 2011/0114378 A1    May 19, 2011

(30) Foreign Application Priority Data

Nov. 17, 2009   (JP) .................................. 2009-262024

(51) Int. Cl.
*H05K 1/16*         (2006.01)

(52) U.S. Cl.
USPC ........................................ 174/260; 361/321.2

(58) Field of Classification Search
None
See application file for complete search history.

(56) References Cited

U.S. PATENT DOCUMENTS

| | | | | |
|---|---|---|---|---|
| 4,695,921 | A | * | 9/1987 | Robbins ..................... 361/308.2 |
| 5,889,445 | A | * | 3/1999 | Ritter et al. ................... 333/172 |
| 7,307,828 | B2 | * | 12/2007 | Ito et al. ..................... 361/321.4 |
| 7,578,896 | B2 | * | 8/2009 | Hibi et al. .................. 156/89.12 |
| 7,719,852 | B2 | * | 5/2010 | Horie et al. ..................... 361/763 |
| 2009/0151991 | A1 | | 6/2009 | Furutani et al. | |

FOREIGN PATENT DOCUMENTS

| | | |
|---|---|---|
| JP | A-2000-133909 | 5/2000 |
| JP | A-2002-223082 | 8/2002 |
| JP | A-2002-232110 | 8/2002 |
| JP | A-2004-153121 | 5/2004 |
| JP | A-2009-071106 | 4/2009 |
| JP | A-2009-164560 | 7/2009 |

* cited by examiner

*Primary Examiner* — Ishwarbhai B Patel
(74) *Attorney, Agent, or Firm* — Oliff PLC

(57) ABSTRACT

A multilayer ceramic capacitor has an element body formed by alternately laminating a plurality of dielectric layers and a plurality of inner electrodes. On a substrate having a mounting surface provided with at least two lands, the multilayer ceramic capacitor is mounted such that the inner electrodes are parallel to the mounting surface. A multilayer ceramic capacitor mounting structure satisfies $T_f/T>0.1$ and $300 \le \epsilon_r \le 2800$, where T is the height of the multilayer ceramic capacitor, $T_f$ is the outer covering thickness of the element body, and $\epsilon_r$ is the relative permittivity of the dielectric layers, and $0.6 \le W_p/W \le 1.0$, where W is the width of the multilayer ceramic capacitor, and $W_p$ is the size of the land in a direction corresponding to the width of the multilayer ceramic capacitor.

3 Claims, 7 Drawing Sheets

Fig.3

| EXPERIMENT NO. | PERMITTIVITY | INTERLAYER THICKNESS | NUMBER OF LAYERS | Tf THICKNESS | T SIZE | Tf/T RATIO | MOUNT DIRECTION | SOUND PRESSURE dB (2~4kHz) | SOUND PRESSURE dB (6~8kHz) | SOUND PRESSURE | SOUND CAPACITY |
|---|---|---|---|---|---|---|---|---|---|---|---|
| 1 | 3000 | 4.0 | 340 | 320 | 2500 | 0.128 | PARALLEL | 56 | 61 | △× | ○ |
| 2 | 2800 | 4.0 | 340 | 320 | 2500 | 0.128 | PARALLEL | 55 | 59 | △△ | ○ |
| 3 | 2500 | 4.0 | 340 | 320 | 2500 | 0.128 | PARALLEL | 53 | 58 | △△ | ○ |
| 4 | 2400 | 4.0 | 340 | 320 | 2500 | 0.128 | PARALLEL | 53 | 59 | △△ | ○ |
| 5 | 2150 | 4.0 | 340 | 320 | 2500 | 0.128 | PARALLEL | 51 | 56 | △△ | ○ |
| 6 | 1500 | 4.0 | 340 | 320 | 2500 | 0.128 | PARALLEL | 49 | 54 | ○△ | ○ |
| 7 | 1000 | 4.0 | 340 | 320 | 2500 | 0.128 | PARALLEL | 47 | 53 | ○△ | ○ |
| 8 | 750 | 4.0 | 340 | 320 | 2500 | 0.128 | PARALLEL | 46 | 52 | ○△ | △ |
| 9 | 500 | 4.0 | 340 | 320 | 2500 | 0.128 | PARALLEL | 44 | 50 | ○△ | △ |
| 10 | 300 | 4.0 | 340 | 320 | 2500 | 0.128 | PARALLEL | 40 | 48 | ○○ | △ |
| 11 | 250 | 4.0 | 340 | 320 | 2500 | 0.128 | PARALLEL | 40 | 47 | ○○ | × |

Fig. 4

| EXPERIMENT NO. | PERMITTIVITY | INTERLAYER THICKNESS | NUMBER OF LAYERS | Ti THICKNESS | T SIZE | Ti/T RATIO | MOUNT DIRECTION | SOUND PRESSURE dB (2~4kHz) | SOUND PRESSURE dB (6~8kHz) | SOUND | CAPACITY |
|---|---|---|---|---|---|---|---|---|---|---|---|
| 12 | 2150 | 4.0 | 340 | 420 | 2700 | 0.156 | PARALLEL | 47 | 53 | ○△ | ○ |
| 13 | 2150 | 4.0 | 340 | 320 | 2500 | 0.128 | PARALLEL | 51 | 56 | △△ | ○ |
| 14 | 2150 | 4.0 | 340 | 245 | 2350 | 0.104 | PARALLEL | 53 | 58 | △△ | ○ |
| 15 | 2150 | 4.0 | 340 | 220 | 2300 | 0.096 | PARALLEL | 54 | 60 | △× | ○ |

Fig. 5

| EXPERIMENT NO. | PERMITTIVITY | INTERLAYER THICKNESS | NUMBER OF LAYERS | Tf THICKNESS | T SIZE | Tf/T RATIO | MOUNT DIRECTION | SOUND PRESSURE dB (2~4kHz) | SOUND PRESSURE dB (6~8kHz) | SOUND PRESSURE | SOUND CAPACITY |
|---|---|---|---|---|---|---|---|---|---|---|---|
| 16 | 2500 | 4.5 | 360 | 180 | 2550 | 0.071 | PERPENDICULAR | 63 | 74 | ×× | ○ |
| 17 | 2500 | 4.5 | 360 | 180 | 2550 | 0.071 | PARALLEL | 40 | 61 | ○× | ○ |
| 18 | 2150 | 4.0 | 340 | 320 | 2500 | 0.128 | PERPENDICULAR | 58 | 71 | △× | ○ |
| 19 | 2150 | 4.0 | 340 | 320 | 2500 | 0.128 | PARALLEL | 51 | 56 | △△ | ○ |
| 20 | 2400 | 3.0 | 355 | 100 | 1660 | 0.060 | PERPENDICULAR | 54 | 63 | △× | ○ |
| 21 | 2400 | 3.0 | 355 | 100 | 1660 | 0.060 | PARALLEL | 47 | 61 | ○× | ○ |

Fig.6

| EXPERIMENT NO. | MOUNT DIRECTION | PAD Wp SIZE | Wp/W RATIO | SOUND PRESSURE dB (2~4kHz) | SOUND PRESSURE dB (6~8kHz) | SOUND | ADHESION STRENGTH |
|---|---|---|---|---|---|---|---|
| 22 | PARALLEL | 3300 | 1.32 | 51 | 56 | △△ | ○ |
| 23 | PARALLEL | 2500 | 0.98 | 38 | 47 | ○○ | ○ |
| 24 | PARALLEL | 2000 | 0.80 | 36 | 47 | ○○ | ○ |
| 25 | PARALLEL | 1800 | 0.72 | 40 | 48 | ○○ | ○ |
| 26 | PARALLEL | 1500 | 0.60 | 38 | 46 | ○○ | ○ |
| 27 | PARALLEL | 1250 | 0.50 | 40 | 47 | ○○ | × |

MULTILAYER CERAMIC CAPACITOR MOUNTING STRUCTURE AND MULTILAYER CERAMIC CAPACITOR

BACKGROUND OF THE INVENTION

1. Field of the Invention

The present invention relates to a multilayer ceramic capacitor mounting structure for mounting a multilayer ceramic capacitor to a substrate and a multilayer ceramic capacitor.

2. Related Background Art

Known as examples of conventional multilayer ceramic capacitor mounting structures are those disclosed in Japanese Patent Application Laid-Open Nos. 2002-232110 and 2004-153121. The mounting structure described in Japanese Patent Application Laid-Open No. 2002-232110 is constructed such that a plurality of ceramic capacitors are arranged in a row on a circuit board, while respective vibrations generated in dielectric layers of the ceramic capacitors and then transmitted to the circuit board have substantially opposite phases. This inhibits the circuit board from generating vibration sounds.

The mounting structure described in Japanese Patent Application Laid-Open No. 2004-153121 constructs a ripple capacitor by attaching metal terminals, each having an L-shaped cross section, to both ends of a capacitor body. The metal terminals are soldered to a substrate such as to space the capacitor body from the substrate surface, so that vibrations caused by ripples of the capacitor body are kept from directly propagating to the substrate, whereby vibration sounds are suppressed.

SUMMARY OF THE INVENTION

However, the structure described in Japanese Patent Application Laid-Open No. 2002-232110 increases the capacitor mounting area of the circuit board as a whole, since a plurality of ceramic capacitors must be mounted on the circuit board. On the other hand, the structure described in Japanese Patent Application Laid-Open No. 2004-153121 inevitably increases the height of the ripple capacitor, since it is mounted to the substrate so as to space the capacitor body from the substrate surface. This is unsuitable for a mounting structure which is limited in the height direction.

It is an object of the present invention to provide a multilayer ceramic capacitor mounting structure and multilayer ceramic capacitor which can reduce vibration sounds occurring in a substrate without increasing the capacitor mounting area of the substrate and without mounting the capacitor such as to space it from the substrate.

The inventors conducted diligent studies about vibration sounds occurring when mounting a multilayer ceramic capacitor to a substrate. As a result, the inventors have found a fact that the occurrence of vibration sounds can be reduced by appropriately defining the relationship between the width of a capacitor and the size of a land of the substrate corresponding to the width of the capacitor, the relationship between the height of the capacitor and the outer covering thickness of an element body, the relative permittivity of dielectric layers, and the arranging direction of inner electrodes with respect to a mounting surface of the substrate, thereby completing the present invention.

The present invention provides a multilayer ceramic capacitor mounting structure; wherein a multilayer ceramic capacitor having an element body formed by alternately laminating a plurality of dielectric layers and a plurality of inner electrodes is mounted to a substrate having a mounting surface provided with at least two lands; wherein the multilayer ceramic capacitor is mounted to the two lands such that the inner electrodes are parallel to the mounting surface; wherein $T_f/T>0.1$ and $300 \le \epsilon_r \le 2800$, where T is the height of the multilayer ceramic capacitor, $T_f$ is the outer covering thickness of the element body, and $\epsilon_r$ is the relative permittivity of the dielectric layers; and wherein $0.6 \le W_p/W \le 1.0$, where W is the width of the multilayer ceramic capacitor, and $W_p$ is the size of the land in a direction corresponding to the width of the multilayer ceramic capacitor.

In the multilayer ceramic capacitor mounting structure of the present invention, the multilayer ceramic capacitor is mounted such that the inner electrodes are parallel to the mounting surface of the substrate. This seems to make it harder for vibrations generated in the multilayer ceramic capacitor to propagate to the substrate than in the case where the multilayer ceramic capacitor is mounted such that the inner electrodes are perpendicular to the mounting surface of the substrate. Setting the ratio ($T_f/T$) between the height T of the multilayer ceramic capacitor and the outer covering thickness $T_f$ of the element body to more than 0.1 is also deemed to make it harder for the vibrations generated in the multilayer ceramic capacitor to propagate to the substrate. Setting the relative permittivity $\epsilon_r$ of the dielectric layers to at least 300 but not exceeding 2800 is supposed to make it harder for the vibrations generated in the multilayer ceramic capacitor to propagate to the substrate, while securing the capacity of the multilayer ceramic capacitor. Setting the ratio ($W_p/W$) between the width W of the multilayer ceramic capacitor and a size $W_p$ of the land in a direction corresponding to the width of the multilayer ceramic capacitor to at least 0.6 but not exceeding 1.0 is speculated to make it harder for the vibrations generated in the multilayer ceramic capacitor to propagate to the substrate, while securing the joint strength between the multilayer ceramic capacitor and the lands. The foregoing can reduce the vibration sounds occurring in the substrate without increasing the capacitor mounting area in order to mount a plurality of multilayer ceramic capacitors to the substrate and without mounting the multilayer ceramic capacitor such as to space it from the substrate.

Letting L be the length of the multilayer ceramic capacitor and $L_d$ be the distance between the outer ends of the two lands, they may satisfy $L_d/L > 1.0$. The joint strength between the multilayer ceramic capacitor and the lands is fully secured in this case.

The present invention provides a multilayer ceramic capacitor having an element body formed by alternately laminating a plurality of dielectric layers and a plurality of inner electrodes; wherein $T_f/T>0.1$ and $300 \le \epsilon_r \le 2800$, where T is the height of the multilayer ceramic capacitor, $T_f$ is the outer covering thickness of the element body, and $\epsilon_r$ is the relative permittivity of the dielectric layers.

When mounting the multilayer ceramic capacitor of the present invention to a substrate, a substrate having a land satisfying $0.6 \le W_p/W \le 1.0$ is used, where W is the width of the multilayer ceramic capacitor, and $W_p$ is the size of the land in a direction corresponding to the width of the multilayer ceramic capacitor. As mentioned above, this can reduce the vibration sounds occurring in the substrate without increasing the capacitor mounting area in order to mount a plurality of multilayer ceramic capacitors to the substrate and without mounting the multilayer ceramic capacitor such as to space it from the substrate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 3 is a table showing results of evaluations concerning the relationship between the relative permittivity $\epsilon_r$ of dielectric layers and the ringing and capacity;

FIG. 4 is a table showing results of evaluations concerning the relationship between the $T_f/T$ ratio and the ringing and capacity;

FIG. 5 is a table showing results of evaluations concerning the relationship between the arranging direction of inner electrodes with respect to a circuit board and the ringing and capacity;

FIG. 6 is a table showing results of evaluations concerning the WW ratio and the ringing and adhesion strength.

DESCRIPTION OF THE PREFERRED EMBODIMENTS

In the following, preferred embodiments of the multilayer ceramic capacitor mounting structure and multilayer ceramic capacitor in accordance with the present invention will be explained in detail with reference to the drawings.

Figure 1:
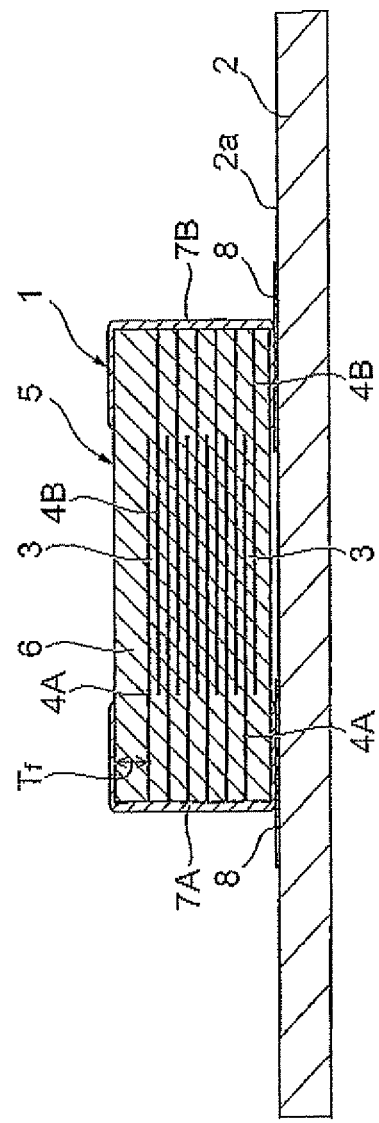
FIG. 1 is a sectional view showing an embodiment of the multilayer ceramic capacitor mounting structure.
Figure 2:
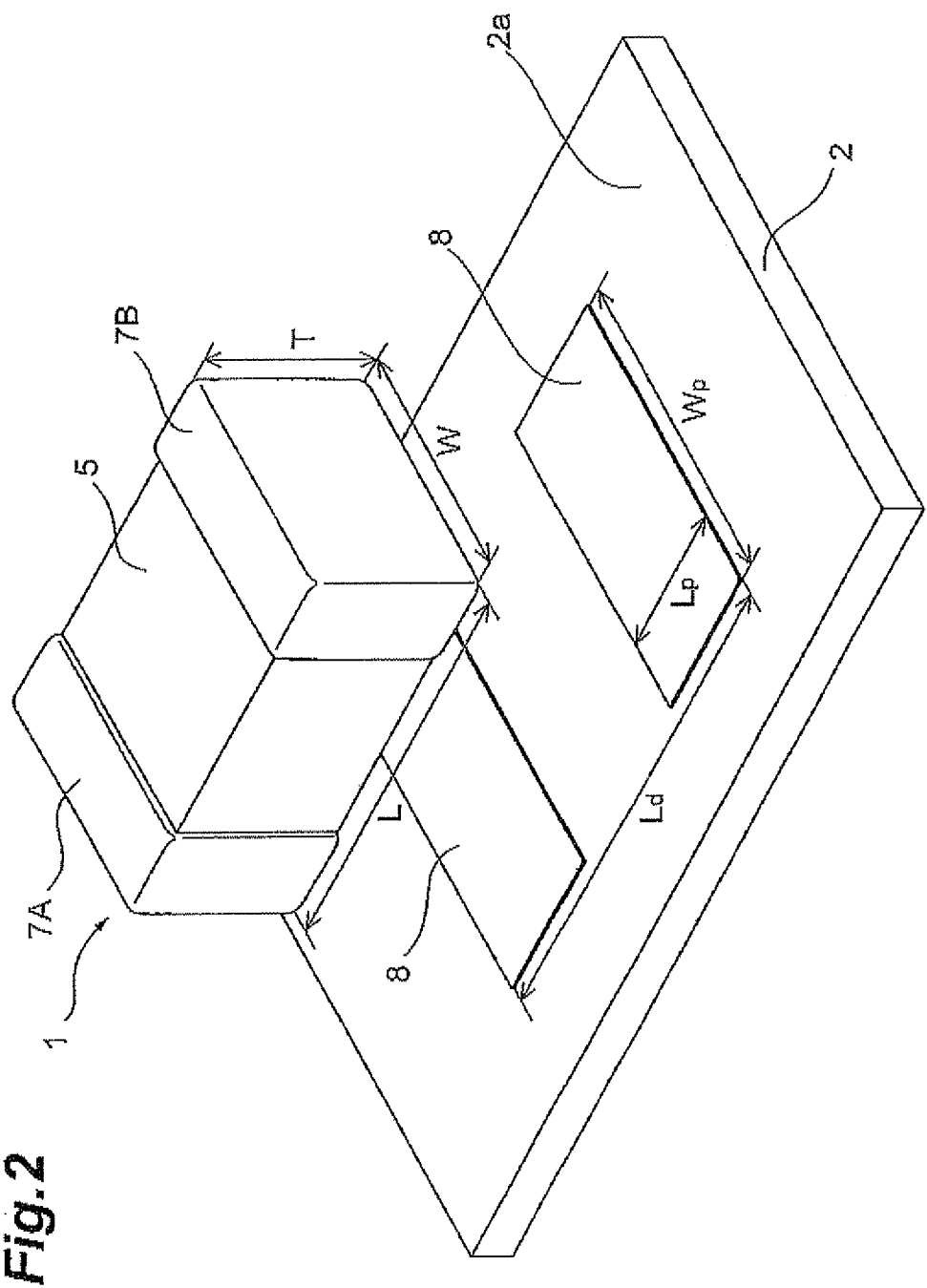
FIG. 2 is an exploded perspective view of the multilayer ceramic capacitor mounting structure shown in FIG. 1.

FIG. 1 is a sectional view showing an embodiment of the multilayer ceramic capacitor mounting structure. FIG. 2 is an exploded perspective view of the multilayer ceramic capacitor mounting structure shown in FIG. 1. In each drawing, the multilayer ceramic capacitor 1 in accordance with this embodiment is mounted to a circuit board 2.

The multilayer ceramic capacitor 1 has a rectangular parallelepiped capacitor element body 5 constituted by a plurality of dielectric layers 3 and a plurality of inner electrodes 4A, 4B. The capacitor element body 5 has a structure in which the inner electrodes 4A, 4B are laminated alternately with the dielectric layers 3. The inner electrodes 4A are drawn to one end face of the capacitor element body 5, while the inner electrodes 4B are drawn to the other end face of the capacitor element body 5. The capacitor element body 5 has an outer covering portion (a lid portion) 6 formed by directly laminating a plurality of dielectric layers 3 on its upper portion.

The dielectric layers 3 are layers mainly composed of barium titanate ($BaTiO_3$), for example, which are formed by firing ceramic green sheets containing $BaTiO_3$. The inner electrodes 4A, 4B are formed from a metal material mainly composed of Ni, Pd, Ag—Pd, Cu, or a Cu alloy, for example.

Arranged on one end side of the capacitor element body 5 is a terminal electrode 7A electrically connected to each of the inner electrodes 4A. The terminal electrode 7A is formed such as to cover one end face of the capacitor element body 5 and one end portion of each side face of the capacitor element body 5. Arranged on the other end side of the capacitor element body 5 is a terminal electrode 7B electrically connected to each of the inner electrodes 4B. The terminal electrode 7B is formed such as to cover the other end face of the capacitor element body 5 and the other end portion of each side face of the capacitor element body 5.

The terminal electrode 7A has a three-layer structure which is not depicted in particular. For example, the three-layer structure comprises an underlayer mainly composed of Cu, Ni, Ag—Pd, or Ag, an Ni plating layer formed on the underlayer, and an Sn plating layer formed on the Ni plating layer.

A pair of rectangular lands (pads) 8 are arranged on a mounting surface 2a of the circuit board 2. The multilayer ceramic capacitor 1 is mounted by soldering such that the terminal electrodes 7A, 7B are connected (joined) to their corresponding lands 8 electrically and mechanically. The multilayer ceramic capacitor 1 is mounted to the circuit board 2 in the following manner, for example. After applying a solder cream to each land 8 through a metal mask, the multilayer ceramic capacitor 1 is mounted on the lands 8. Thereafter, the circuit board 2 is passed through a reflow furnace, so as to melt and fix the solder.

When an AC voltage is applied to the terminal electrodes 7A, 7B of the multilayer ceramic capacitor 1 in the foregoing mounting structure of the multilayer ceramic capacitor 1, the multilayer ceramic capacitor 1 generates electrostrictive vibrations. As the vibrations propagate to the circuit board 2, the vibrations of the multilayer ceramic capacitor 1 may resonate with those of the circuit board 2, thereby generating resonance sounds (vibration sounds).

For avoiding such problems, this embodiment defines the arranging direction of the inner electrodes 4A, 4B with respect to the mounting surface 2a of the substrate 2, the relationship between the size of the multilayer ceramic capacitor 1 and the size and position of the lands 8, and the relative permittivity of the dielectric layers 3 as follows.

The multilayer ceramic capacitor 1 is mounted to the lands 8 such that the inner electrodes 4A, 4B are arranged parallel to the mounting surface 2a of the circuit board 2. Here, for example, the upper and lower faces of the multilayer ceramic capacitor 1 are provided with markings, which are read when mounting the multilayer ceramic capacitor 1 to the circuit board 2, whereby the inner electrodes 4A, 4B can be arranged parallel to the mounting surface 2a of the circuit board 2 easily and reliably.

Letting T be the height of the multilayer ceramic capacitor 1, W be the width of the multilayer ceramic capacitor 1, $W_p$ be the size of each land 8 in a direction corresponding to the width W of the multilayer ceramic capacitor 1, $T_f$ be the thickness of the outer covering portion 6, and $\epsilon_r$ be the relative permittivity of the dielectric layers 3, the following relationships are satisfied:

$$T_f/T > 0.1 \quad (A)$$

$$300 \le \epsilon_r \le 2800 \quad (B)$$

$$0.6 \le W_p/W \le 1.0 \quad (C)$$

For securing the joint strength between the multilayer ceramic capacitor 1 and the circuit board 2, it is preferred that $$L_d/L > 1.0$$

where L is the length of the multilayer ceramic capacitor, and $L_d$ is the distance between the outer ends of the lands 8.

Results of evaluating the multilayer ceramic capacitor mounting structure by experiments carried out while varying the parameters and arranging direction of inner electrodes mentioned above will now be explained.

Each of the multilayer ceramic capacitors used in the experiments had a size of 3.2 mm (L)×2.5 mm (W). The height T was varied within the range not exceeding 2.7 mm. Employed as the circuit board was one made of a material of FR4 (Flame Retardant Type 4) having a size of 100 mm (L)×40 mm (W)×1.6 mm (T).

(1) Relationship Between the Relative Permittivity $\epsilon_r$ of Dielectric Layers and the Ringing and Capacity The sound pressure occurring in the circuit board was measured, so as to evaluate the ringing (resonance sounds), and the capacity of the multilayer ceramic capacitor was also evaluated. Here, as shown in FIG. 3, the $T_r/T$ ratio was 0.128, while the inner electrodes were arranged parallel to the mounting surface of the circuit board. The relative permittivity $\epsilon_r$ of dielectric layers was varied within the range of 250 to 3000.

For measuring the sound pressure, a simplified anechoic box FAV-3 (manufactured by Kokuyo Electric Co., Ltd.), a signal generator, an oscilloscope for verification, and an analysis software DS-0221 (manufactured by Ono Sokki Co., Ltd.) were used, A microphone and a sample (a circuit board having a capacitor mounted thereto) were put into the anechoic box such that the sample was separated from the microphone by 5 cm. In this state, the signal generator applied an AC voltage to the sample under an oscillation condition with a frequency of 1 kHz at a step of 0.5 kHz and a DC bias of 20 V, and the sound pressure occurring in the circuit board was measured.

The results of measurement and evaluation are as shown in FIG. 3. The sound pressure becomes higher as the relative permittivity $\epsilon_r$ of dielectric layers increases. This seems to be because vibrations are easier to propagate from the capacitor to the circuit board as the relative permittivity $\epsilon_r$ of dielectric layers is higher. The sound pressures of less than 50 dB, at least 50 dB but less than 60 dB, and 60 dB or more are evaluated as good, fair, and poor, which are indicated by circle, triangle, and cross signs, respectively. The results shown in FIG. 3 make it clear that the relative permittivity $\epsilon_r$ of 2800 or less in the dielectric layers is effective in inhibiting the circuit board from ringing. The results shown in FIG. 3 also show that the relative permittivity $\epsilon_r$ of 300 or more in the dielectric layers is effective in securing a minimum capacitor capacity. The foregoing leads to the above-mentioned expression (B).

(2) Relationship Between the $T_r/T$ Ratio and the Ringing and Capacity

The sound pressure occurring in the circuit board was measured, so as to evaluate the ringing, and the capacity of the multilayer ceramic capacitor was also evaluated. Here, as shown in FIG. 4, the relative permittivity $\epsilon_r$ of dielectric layers was set to 2150, while the inner electrodes were arranged parallel to the mounting surface of the circuit board. The $T_r/T$ ratio was varied by changing the height T of the multilayer ceramic capacitor within the range of 2300 to 2700 μm and the thickness $T_r$ of the outer covering portion of the element body within the range of 220 to 420 μm.

The results of measurement and evaluation are as shown in FIG. 4. The sound pressure becomes lower as the $T_r/T$ ratio increases. This seems to be because vibrations are harder to propagate from the capacitor to the circuit board as the thickness $T_r$ of the outer covering portion of the element body is greater. Criteria for the sound pressure evaluation are as mentioned above. The results shown in FIG. 4 make it clear that the $T_r/T$ ratio exceeding 0.1 is effective in inhibiting the circuit board from ringing. That is, the above-mentioned expression (A) is derived from them.

(3) Relationship Between the Arranging Direction of Inner Electrodes with Respect to the Circuit Board and the Ringing and Capacity The sound pressure occurring in the circuit board was measured, so as to evaluate the ringing, and the capacity of the multilayer ceramic capacitor was also evaluated. Here, as shown in FIG. 5, the relative permittivity $\epsilon_r$ of dielectric layers was 2500, 2150, or 2400, while the $T_r/T$ ratio was 0.071, 0.128, or 0.060. The inner electrodes were arranged parallel or perpendicular to the mounting surface of the circuit board.

The results of measurement and evaluation are as shown in FIG. 5. Under any of the three conditions, the sound pressure is lower when the inner electrodes are arranged parallel to the mounting surface of the circuit board than when perpendicular thereto. This seems to be because vibrations are harder to propagate from the capacitor to the circuit board when the inner electrodes are arranged parallel to the mounting surface of the circuit board. Criteria for the sound pressure evaluation are as mentioned above. The results shown in FIG. 5 make it clear that mounting the capacitor such that the inner electrodes are parallel to the mounting surface of the circuit board is effective in inhibiting the circuit board from ringing.

(4) Relationship Between the $W_p/W$ Ratio and the Ringing and Adhesion Strength The sound pressure occurring in the circuit board was measured, so as to evaluate the ringing, and the adhesion strength of the capacitor to the circuit board was also evaluated. Here, as shown in FIG. 6, the inner electrodes were arranged parallel to the mounting surface of the circuit board. The $W_p/W$ ratio was varied by changing the size $W_p$ of the land in a direction corresponding to the width W of the capacitor within the range of 1250 to 3300 μm. The relative permittivity $\epsilon_r$, interlayer thickness, and number of layers of dielectric layers were 2150, 4.0 μm, and 340, respectively, while the width W of the capacitor was 2500 μm.

Figure 7:
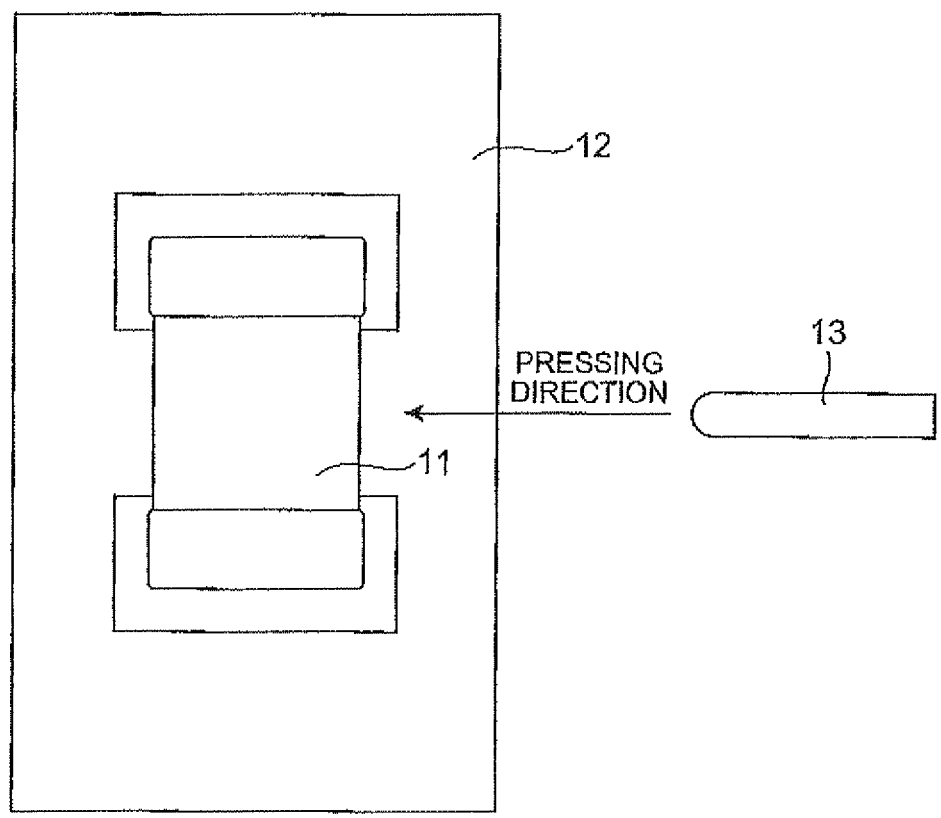
FIG. 7 is a schematic diagram showing a method for evaluating the adhesion strength of a multilayer ceramic capacitor.

In the adhesion strength test, as shown in FIG. 7, for example, a pressing jig 13 made of cemented carbide is moved at a speed of 30 mm/min to a side face of a capacitor 11 mounted on a circuit board 12, so as to press the capacitor 11. Here, the adhesion strength is evaluated according to whether or not the capacitor 11 breaks under a load of 10 N.

The results of measurement and evaluation are as shown in FIG. 6. The sound pressure becomes higher when the $W_p/W$ ratio exceeds 1.0. This seems to be because vibrations are harder to propagate from the capacitor to the circuit board as the $W_p/W$ ratio increases. Criteria for the sound pressure evaluation are as mentioned above. The results shown in FIG. 6 make it clear that the $W_p/W$ ratio of 1.0 or less is effective in inhibiting the circuit board from ringing. The results shown in FIG. 6 also show that the $W_p/W$ ratio of 0.6 or more is effective in securing a minimum adhesion strength of the capacitor to the circuit board. The foregoing leads to the above-mentioned expression (C).

As in the foregoing, this embodiment mounts the multilayer ceramic capacitor 1 to the lands 8 of the circuit board 2 such that the inner electrodes 4A, 4B are parallel to the mounting surface 2a of the circuit board 2, while satisfying the above-mentioned expressions (A) to (C). This can reduce unpleasant resonance sounds (ringing) occurring in the circuit board 2, while securing the capacity of the multilayer ceramic capacitor 1 and the adhesion strength between the multilayer ceramic capacitor 1 and the circuit board 2. Therefore, in order to suppress the ringing, it is unnecessary for the circuit board 2 to mount a large number of multilayer ceramic capacitors 1 by increasing the capacitor mounting area and mount the multilayer ceramic capacitor 1 such as to space it from the mounting surface 2a by using metal terminals. As a result, the multilayer structure of the multilayer ceramic capacitor 1 can be made smaller.

The present invention is not limited to the above-mentioned embodiment. For example, while the lands 8 disposed on the mounting surface 2a of the circuit board 2 have a rectangular form in the above-mentioned embodiment, they may have a substantially rectangular form, a circular form, or the like.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer ceramic capacitor mounting structure comprising:
a multilayer ceramic capacitor having an element body formed by alternately laminating a plurality of dielectric layers and a plurality of inner electrodes,
wherein:
the multilayer ceramic capacitor is mounted to a substrate having a mounting surface provided with at least two lands;
the multilayer ceramic capacitor is mounted to the two lands such that the inner electrodes are parallel to the mounting surface;
$T_f/T > 0.1$ and $300 \leq \epsilon_r \leq 2800$, where T is a height of the multilayer ceramic capacitor, $T_f$ is an outer covering thickness of the element body, and $\epsilon_r$ is a relative permittivity of the dielectric layers;
the height T is in a range of from 2350 to 2700 μm;
the thickness $T_f$ is in a range of from 245 to 420 μm; and
$0.6 \leq W_p/W \leq 1.0$, where W is a width of the multilayer ceramic capacitor, and $W_p$ is a size of the land in a direction corresponding to the width of the multilayer ceramic capacitor.

2. A multilayer ceramic capacitor mounting structure according to claim 1, wherein $L_d/L > 1.0$, where:
L is a length of the multilayer ceramic capacitor, and
$L_d$ is a distance between outer ends of the two lands.

3. A multilayer ceramic capacitor having an element body formed by alternately laminating a plurality of dielectric layers and a plurality of inner electrodes;
wherein:
$T_f/T > 0.1$ and $300 \leq \epsilon_r \leq 2800$, where:
T is a height of the multilayer ceramic capacitor,
$T_f$ is an outer covering thickness of the element body, and
$\epsilon_r$ is a relative permittivity of the dielectric layers;
the height T is in a range of from 2350 to 2700 μm; and
the thickness $T_f$ is in a range of from 245 to 420 μm.

* * * * *